(12) United States Patent
Pankow et al.

(10) Patent No.: US 9,013,018 B2
(45) Date of Patent: Apr. 21, 2015

(54) MULTILAYER MOISTURE BARRIER

(75) Inventors: Joel W. Pankow, Littleton, CO (US); Gary J. Jorgensen, Pine, CO (US); Kent M. Terwilliger, Lakewood, CO (US); Stephen H. Glick, Evergreen, CO (US); Nora Isomaki, Espoo (FI); Kari Harkonen, Kauniainen (FI); Tommy Turkulainen, Kirkkonummi (FI)

(73) Assignees: Beneq Oy, Vantaa (FI); U.S. Department of Energy, Washington, DC (US)

( * ) Notice: Subject to any disclaimer, the term of this patent is extended or adjusted under 35 U.S.C. 154(b) by 124 days.

(21) Appl. No.: 13/579,459

(22) PCT Filed: Feb. 17, 2011

(86) PCT No.: PCT/US2011/025314
§ 371 (c)(1),
(2), (4) Date: Sep. 12, 2012

(87) PCT Pub. No.: WO2011/103341
PCT Pub. Date: Aug. 25, 2011

(65) Prior Publication Data
US 2013/0009264 A1 Jan. 10, 2013

Related U.S. Application Data

(60) Provisional application No. 61/305,776, filed on Feb. 18, 2010.

(51) Int. Cl.
H01L 31/0203 (2014.01)
H01L 31/048 (2014.01)
(Continued)

(52) U.S. Cl.
CPC ...... *H01L 31/0481* (2013.01); *B32B 17/10018* (2013.01); *B32B 2367/00* (2013.01); *Y02E 10/50* (2013.01); *H01L 31/049* (2013.01)

(58) Field of Classification Search
CPC ............ B32B 9/04; B32B 5/00; B32B 27/00; B32B 27/08; H01L 31/0203; H01L 21/31
USPC ............................. 257/433, E21.24, E31.117
See application file for complete search history.

(56) References Cited

U.S. PATENT DOCUMENTS 6,465,726 B2 10/2002 Yamada et al.
7,612,937 B2 * 11/2009 Jorgensen et al. ............ 359/361
(Continued)

OTHER PUBLICATIONS

May 12, 2011 International Search Report issued in International Patent Application No. PCT/US2011/025314.
(Continued)

*Primary Examiner* — Caleb Henry
(74) *Attorney, Agent, or Firm* — Oliff PLC

(57) ABSTRACT

A moisture barrier, device or product having a moisture barrier or a method of fabricating a moisture barrier having at least a polymer layer, and interfacial layer, and a barrier layer. The polymer layer may be fabricated from any suitable polymer including, but not limited to, fluoropolymers such as polyethylene terephthalate (PET) or polyethylene naphthalate (PEN), or ethylene-tetrafluoroethylene (ETFE). The interfacial layer may be formed by atomic layer deposition (ALD). In embodiments featuring an ALD interfacial layer, the deposited interfacial substance may be, but is not limited to, $Al_2O_3$, $AlSiO_x$, $TiO_2$, and an $Al_2O_3/TiO_2$ laminate. The barrier layer associated with the interfacial layer may be deposited by plasma enhanced chemical vapor deposition (PECVD). The barrier layer may be a $SiO_xN_y$ film.

6 Claims, 10 Drawing Sheets

(51) Int. Cl.
*B32B 17/10* (2006.01)
*H01L 31/049* (2014.01)

(56) References Cited

U.S. PATENT DOCUMENTS

| 2002/0003403 | A1 | 1/2002 | Ghosh et al. | |
|---|---|---|---|---|
| 2006/0246811 | A1 | 11/2006 | Winters et al. | |
| 2007/0193623 | A1* | 8/2007 | Krasnov | 136/252 |
| 2007/0295385 | A1* | 12/2007 | Sheats et al. | 136/251 |
| 2007/0295386 | A1* | 12/2007 | Capps et al. | 136/251 |
| 2007/0295387 | A1 | 12/2007 | Adriani et al. | |
| 2007/0295388 | A1* | 12/2007 | Adriani et al. | 136/251 |
| 2007/0295389 | A1* | 12/2007 | Capps et al. | 136/251 |
| 2007/0295390 | A1* | 12/2007 | Sheats et al. | 136/251 |
| 2008/0020503 | A1* | 1/2008 | Sheats et al. | 438/34 |
| 2008/0047599 | A1* | 2/2008 | Buller et al. | 136/251 |
| 2008/0196664 | A1 | 8/2008 | David et al. | |
| 2010/0079064 | A1* | 4/2010 | Kimura et al. | 313/504 |

OTHER PUBLICATIONS

Carcia et al., "Ca test of $Al_2O_3$ gas diffusion barriers grown by atomic layer deposition on polymers," Applied Physics Letters, vol. 89, 2006.

Dameron et al., "Gas Diffusion Barriers on Polymers Using Multilayers Fabricated by $Al_2O_3$ and Rapid $SiO_2$ Atomic Layer Deposition," J. Phys. Chem. C., vol. 112, No. 12, 2008.

Groner et al., "Gas diffusion barriers on polymers using $Al_2O_3$ atomic layer deposition," Applied Physics Letters, vol. 88, 2006.

May 12, 2011 Written Opinion of the International Search Authority issued in International Patent Application No. PCT/US2011/025314.

\* cited by examiner

MULTILAYER MOISTURE BARRIER

CROSS-REFERENCE TO RELATED APPLICATIONS

The present application claims priority from the U.S. Provisional Application No. 61/305,776, filed 18 Feb. 2010; the subject matter of which hereby is specifically incorporated herein by reference for all that it discloses and teaches.

CONTRACTUAL ORIGIN

The United States Government has rights in this invention under Contract No. DE-AC36-08GO28308 between the United States Department of Energy and the National Renewable Energy Laboratory, managed and operated by the Alliance for Sustainable Energy, LLC.

BACKGROUND

Many semiconductor devices are designed to be implemented outdoors or in similar uncontrolled and potentially harsh environments. For example, photovoltaic cells must be mounted where the amounts of sunlight reaching the cells tends to be maximized. The typical outdoor mounting of photovoltaic cells and similar semiconductor apparatus necessarily exposes these devices to rain, snow, dew, or other harsh and wet environments. The operative layers and surfaces of many semiconductor devices such as photovoltaic cells may be degraded through contact with water, water vapor or other substances potentially present in the installation environment. Accordingly, devices such as photovoltaic cells are typically encapsulated or packaged in some type of moisture barrier structure or protective material.

Devices subjected to moist environments may be placed in a separate weather proof enclosure, possibly having relatively impermeable glass windows. Alternatively a device may be potted in a heavy and weather resistant material such as an epoxy resin, should the opacity of certain potting materials not prove problematic. Glass weather barriers and similar materials, however, are relatively heavy, inflexible, prone to breakage and difficult to handle or install. Therefore, technologies have been developed for associating a relatively thin and flexible moisture barrier with the exterior and or interior surfaces of a semiconductor device such as a photovoltaic cell. A thin film moisture barrier may be deposited directly onto the device in one or more manufacturing steps. Alternatively, a free standing thin film moisture barrier may be engineered and prepared in advance and subsequently laminated to the device or otherwise used to package the device.

To perform efficaciously a moisture barrier must resist the transmission of water or water vapor over a wide range of temperatures. In addition, the layers of an effective moisture barrier must remain laminated to each other. Similarly, the entire barrier must properly adhere to the intended substrate of the engineered device package. Certain known moisture barriers initially provide suitable moisture resistance and adequate adhesion properties but subsequently fail upon long term exposure to heat or moisture. Barrier failure over a length of time is particularly common when the moisture barrier is exposed to damp heat, such as is common if the device is a photovoltaic cell. The embodiments disclosed herein are directed toward overcoming one or more of the problems discussed above.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment disclosed is a moisture barrier having at least a polymer layer, and interfacial layer, and a barrier layer. The polymer layer may be fabricated from any suitable polymer including, but not limited to, organic polymers such as polyethylene terephthalate (PET) or polyethylene naphthalate (PEN), or fluoropolymers such as ethylene-tetrafluoroethylene (ETFE). The interfacial layer may be formed by atomic layer deposition (ALD). In embodiments featuring an ALD interfacial layer, the deposited interfacial substance may be, but is not limited to, $Al_2O_3$, $AlSiO_x$, $TiO_2$, and an $Al_2O_3/TiO_2$ laminate or other dense protective material layers. The barrier layer associated with the interfacial layer may be deposited by plasma enhanced chemical vapor deposition (PECVD). The barrier layer may be a $SiO_xN_y$ film or other appropriate protective material layers.

Another embodiment is a device having, or packaged in, a moisture barrier as described above. Representative devices which may be associated with a moisture barrier include, but are not limited to, integrated circuit devices, photonic devices, batteries, piezoelectric devices, micro-electromechanical systems, sensors, actuators, flat panel displays, food, pharmaceuticals, consumer goods, cosmetics and similar devices, products and apparatus.

An alternative embodiment includes a method of forming a moisture barrier. The method includes providing a polymer layer, depositing an ALD interfacial layer on the polymer layer, and depositing a barrier layer on the ALD interfacial layer. The method may further include providing a device substrate and associating the barrier layer with the device substrate. In addition to the exemplary aspects and embodiments described above, further aspects and embodiments will become apparent by reference to the drawings and by study of the following descriptions.

BRIEF DESCRIPTION OF THE DETAILED DRAWINGS

Figure 7:
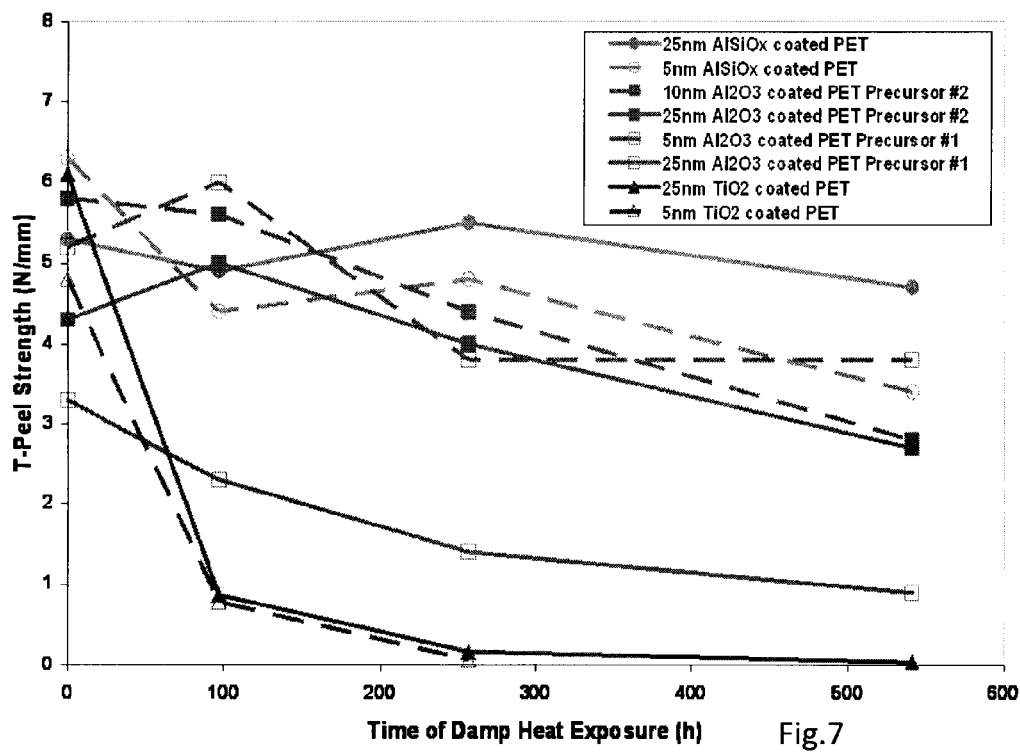
FIG. 7 is a graphic representation of the T-peel strength of ALD-coated PET samples where the ALD coating was applied in a thin layer.
Figure 8A:
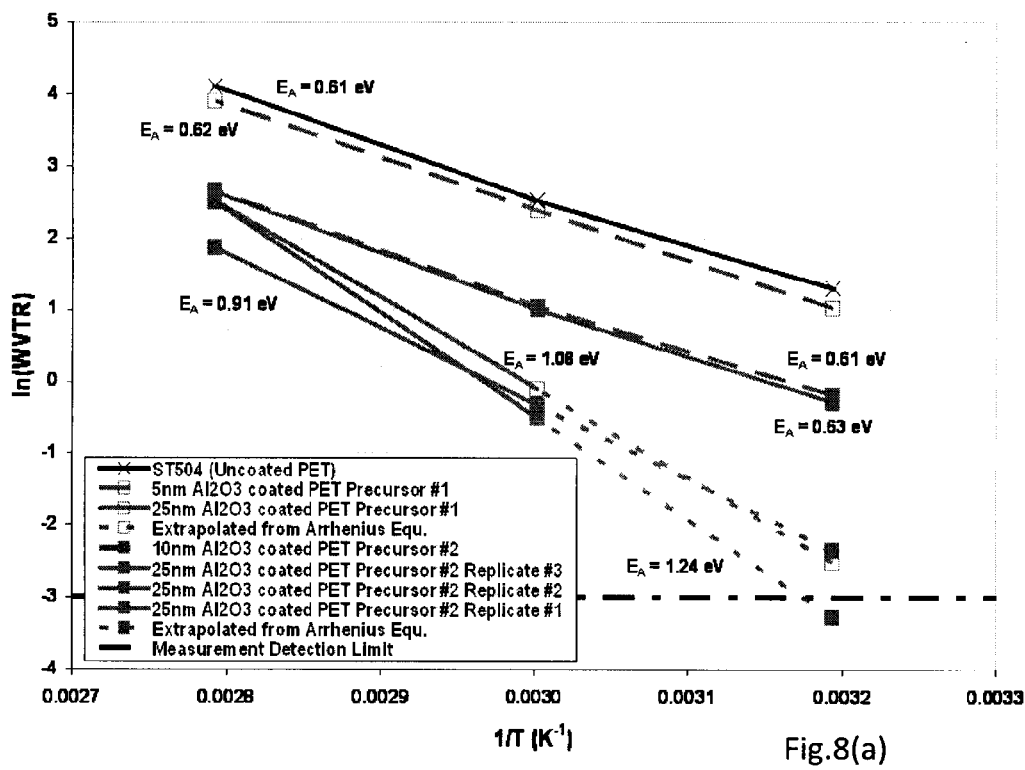
Figure 8B:
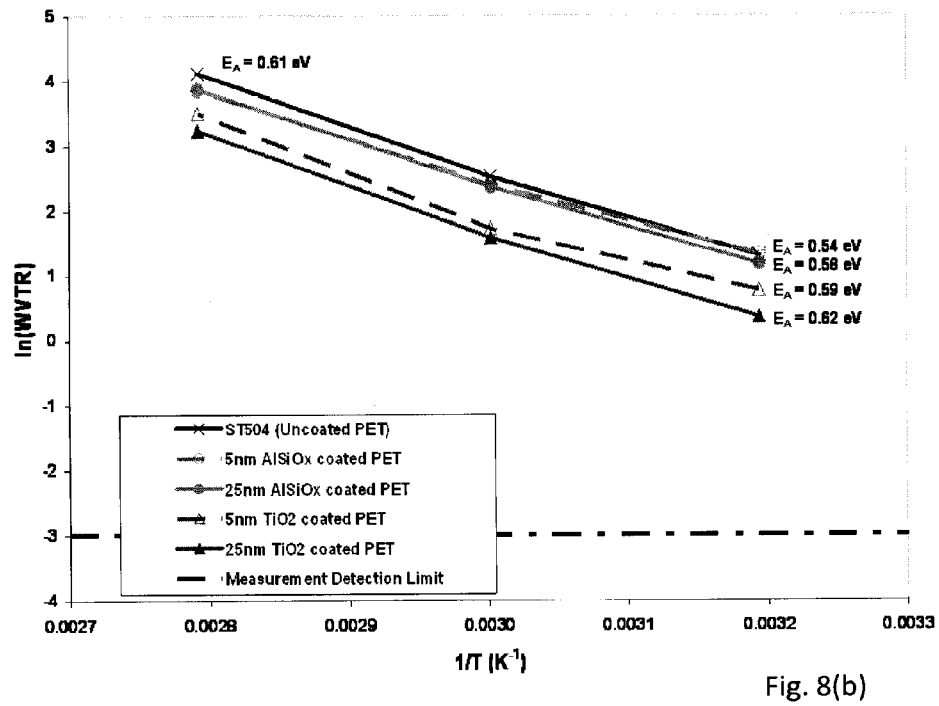

FIGS. 8(a) and 8(b) are graphic representations of the WVTR characteristics of the samples of FIG. 7.

Figure 9:
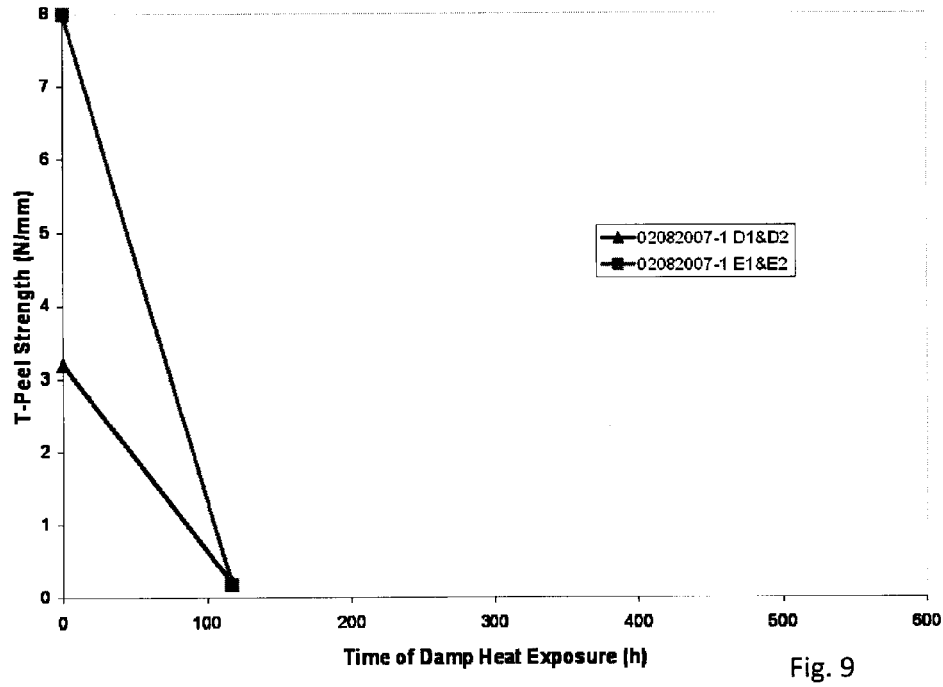

FIG. 9 is a graphic representation of T-peel strength as a function of the length of damp heat exposure for PECVD coated PET materials.

Figure 10:
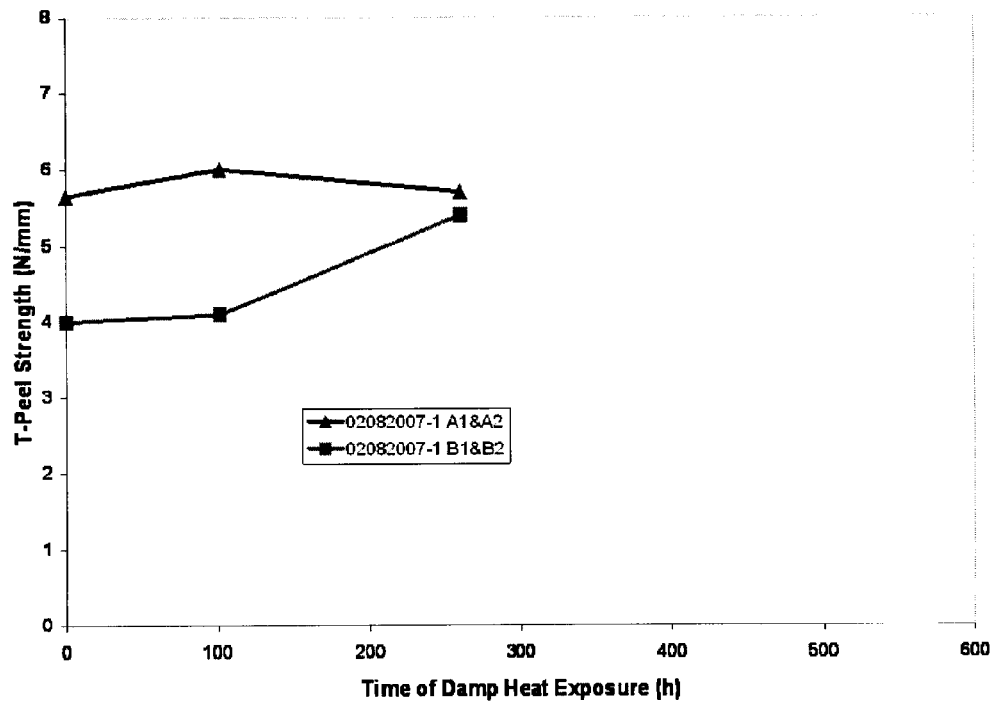

FIG. 10 is a graphic representation of T-peel strength as a function of time of damp heat exposure for PECVD coating on an ALD deposited interfacial layer on PET.

Figure 11:
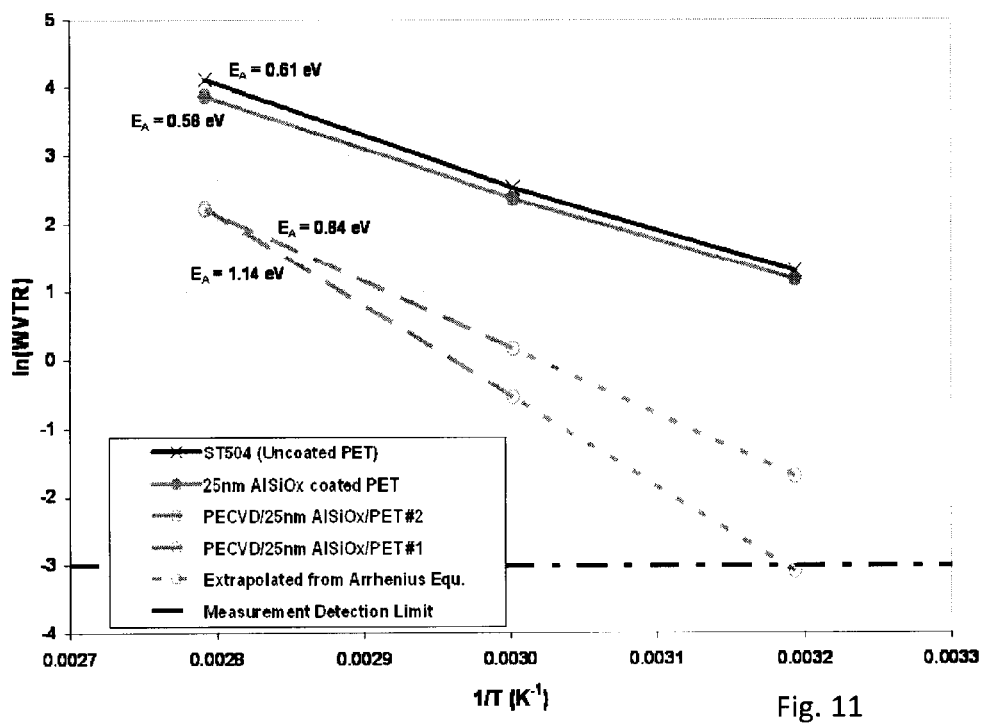

FIG. 11 is a graphic representation of the WVTR measurements of the samples illustrated in FIG. 10.

Figure 12:
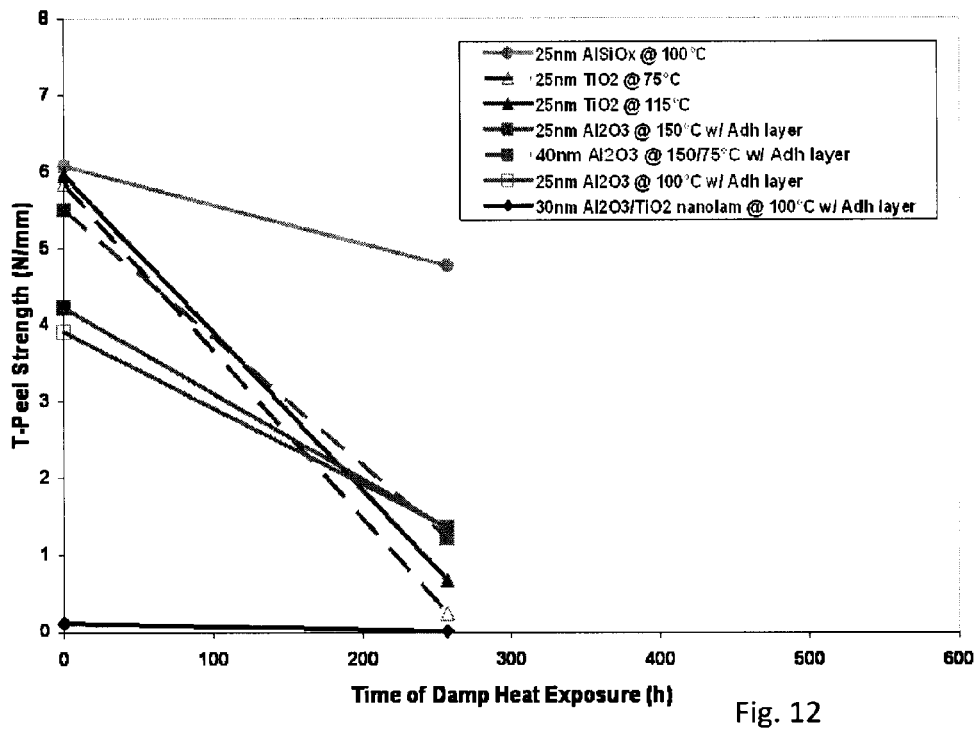

FIG. 12 is a graphic representation of T-peel strength as a function of the time of damp heat exposure for alternative samples having an ALD deposited layer on PET at selected temperatures.

Figure 13A:
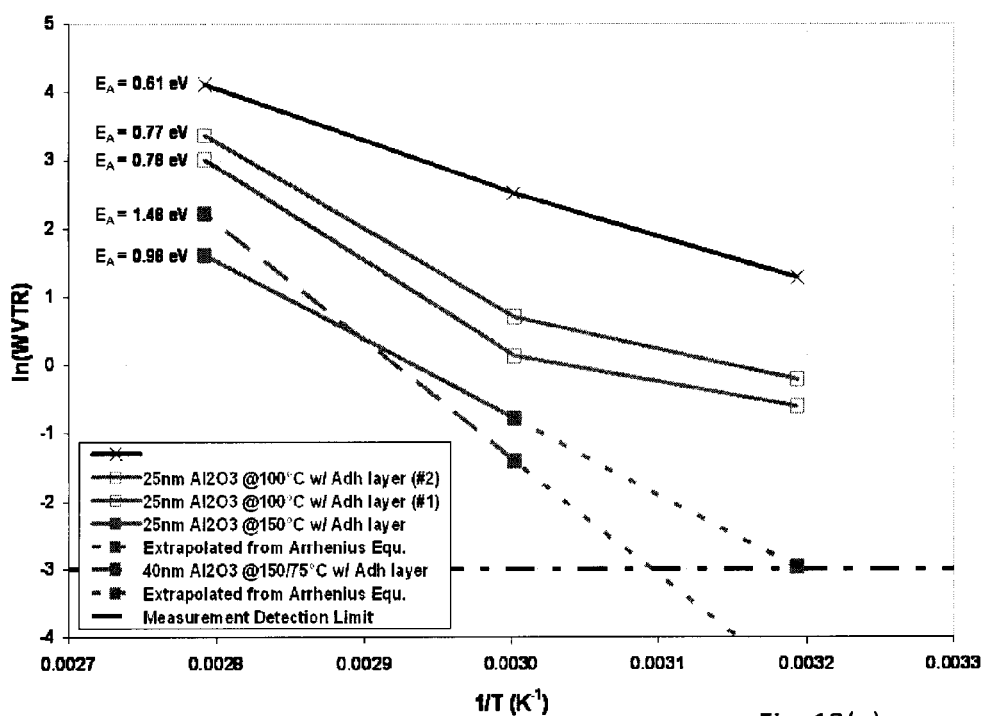
Figure 13B:
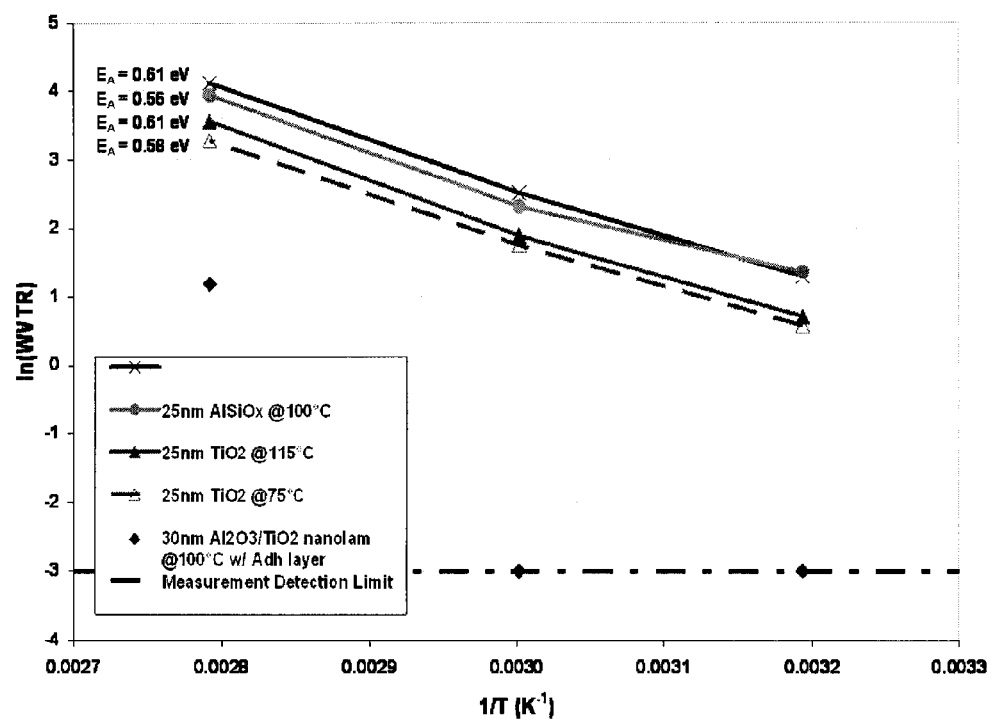

FIGS. 13a and 13b are graphic representations of the WVTR characteristics of the samples of FIG. 12.

Exemplary embodiments are illustrated in the referenced figures of the drawings. It is intended that the embodiments and figures disclosed herein are to be considered illustrative rather than limiting.

DETAILED DESCRIPTION

Figure 1:
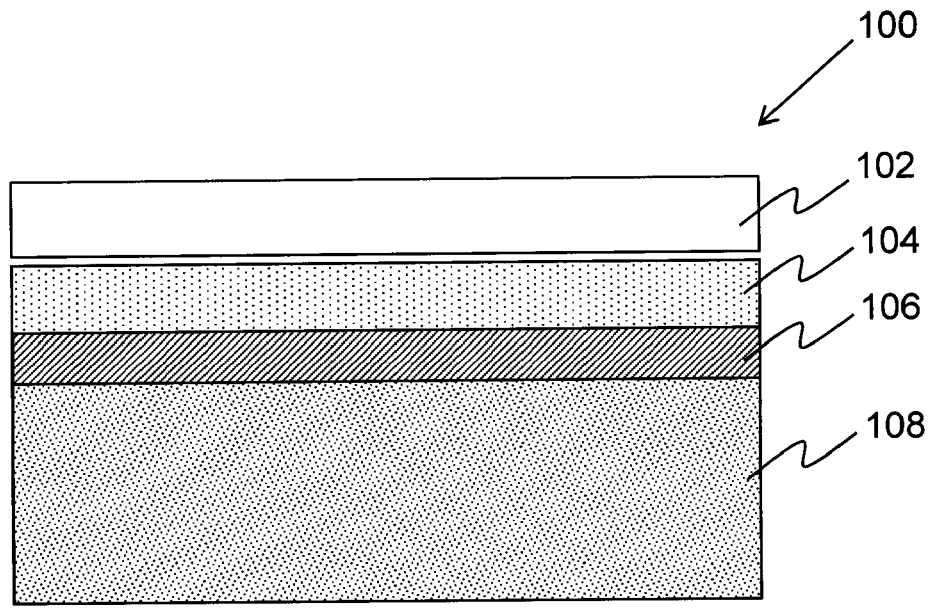
FIG. 1 is a diagrammatic representation of a moisture barrier.

One embodiment disclosed herein is a moisture barrier 100 as illustrated in FIG. 1. The moisture barrier of FIG. 1 includes a polymer layer 102, an interfacial layer 104 associated with the polymer layer and a barrier layer 106 associated with the interfacial layer. The moisture barrier 100 may be associated with a device or substrate 108 as shown in FIG. 1. The moisture barrier will generally serve to protect the device or substrate 108 from water, water vapor, or other substances present in the environment which may serve to degrade or damage the device or substrate 108.

The moisture barrier 100 serves as a robust packaging solution to enclose moisture sensitive encapsulated materials. The encapsulated material, device or substrate 108 may be, but is not limited to, a semiconductor device such as a photovoltaic cell. Other devices or items which may be packaged or protected by or within the various embodiments of moisture barriers disclosed herein include, but are not limited to, integrated circuit devices, photonic devices, batteries, piezoelectric devices, micro-electromechanical systems, sensors, actuators, flat panel displays, food, pharmaceuticals, consumer goods, cosmetics and similar devices, products and apparatus. Substrates which may be enclosed in a moisture barrier include, but are not limited to, silicon, other semiconductor substrates, thin film substrates including but not limited to CdTe, CIGS or similar photovoltaic devices, organic substrates, including but not limited to organic photovoltaic substrates, mirrored surfaces, plastics, polymers or metals.

The polymer layer 102 may be fabricated from any polymer which has characteristics making it suitable for use as a moisture barrier. For example, the polymer may be flexible, durable, and relatively moisture resistant. In certain implementations it may be desirable that the polymer be transparent to selected wavelengths of light, for instance if the moisture barrier 100 is to be used to package the front surface of a solar cell. In addition, the polymer layer 102 may be fabricated from a material which is suitable for receiving and adhering to the subsequent layers described herein.

Suitable polymers for the implementation of a polymer layer 102 include, but are not limited to organic polymers such as polyethylene terephthalate (PET) or polyethylene naphthalate (PEN) or fluoropolymers, for example ethylenetetrafluroethylene (ETFE) and similar polymer films. In alternative embodiments, the interfacial layer 104 and barrier layer 106 as described herein may be applied directly to a substrate, without using a polymer layer 102. For example, the interfacial layer 104 and barrier layer 106 could be applied directly to a silicon wafer, thin film semiconductor layers, organic substrates, a device, aluminum or other metallic mirror surface or similar substrates. The use of a polymer layer 102 is advantageous in certain situations since a polymer layer 102 or other layers deposited thereon may be prepared in sheet form separate from the device which will ultimately be packaged in the moisture barrier 100. Accordingly, the completed multi-layered moisture barrier embodiments described herein may be subsequently applied to any number of different types of device or substrate.

It is important to note that the generalized embodiment of FIG. 1 is illustrated as having three layers. This configuration is not, however, to be construed as limiting. For example, a moisture barrier which is consistent with the embodiments disclosed herein may be implemented with more than or less than three layers. A moisture barrier may include layers in addition to those shown on FIG. 1 or multiple instances of the layers shown on FIG. 1. Also, it is important to note that the layers shown on FIG. 1 may in certain instances be made up of multiple, even thousands of sub-layers. This is particularly common if the layers are fabricated by one of numerous material deposition techniques.

As shown on FIG. 1, an interfacial layer 104 may be associated with the polymer layer 102. An effective interfacial layer 104 may be fabricated using any known process provided the interfacial layer 104 provides suitable intra-layer adhesion among the other layers in contact with the interfacial layer. In addition, a suitable interfacial layer will not degrade or compromise the moisture barrier characteristics of adjacent layers. As described in detail below, a suitable interfacial layer 104 may be formed by atomic layer deposition (ALD). The embodiments disclosed herein are not limited to ALD interfacial layers, however, and other suitable deposition techniques may be used to implement an effective interfacial layer. Prior known moisture barriers having multiple layers often suffer from delamination when exposed to moisture at high temperature for an extended period of time.

As described in detail below, an ALD interfacial layer 104 provides robust adhesion between the barrier layer 106 and underlying polymer layer 102 which withstand damp heat quite well.

ALD is well suited for depositing an interfacial layer 104 since ALD provides a substantially pin hole free film with high surface conformality. ALD typically uses two or more chemicals to create alternative, saturated chemical reactions on a growth or deposition surface such as the polymer film 102. The ALD layer growth rate may ideally be maintained at one or more monolayer per deposition cycle. Thus, ALD may utilize multiple cycles until the required film thickness is achieved. ALD may be utilized to deposit various compounds, for example an oxide interfacial layer. The oxides deposited may include, but are not limited to the following: $Al_2O_3$, $TiO_2$, $Ta_2O_5$, $ZrO_2$, $HfO_2$, $SnO_2$, $ZnO$, $La_2O_3$, $Y_2O_3$, $CeO_2$, $Sc_2O_3$, $Er_2O_3$, $V_2O_5$, $SiO_2$, $In_2O_3$, $SiO_x$ and various other metal oxides, metal nitrides, metal oxynitrides or metallic compounds.

Similarly, ALD may be used to deposit nanolaminate (multiple compound) films which are also well suited for use as an interfacial layer 104. Nanolaminate materials include, but are not limited to, the following: $HfO_2/Ta_2O_5$, $TiO_2/Ta_2O_5$, $TiO_2/Al_2O_3$, $ZnS/Al_2O_3$, and $Al_2O_3/TiO_2$.

An ALD interfacial layer may be deposited at a selected temperature. For example, an ALD interfacial layer may be deposited at a temperature of less than 100° C. Alternatively, an ALD interfacial layer may be deposited at a temperature of between 100° C. and 150° C. Alternatively, an ALD interfacial layer may be deposited at a temperature of greater than 150° C. The deposition temperature may be selected for compatibility with the material or substrate upon which the ALD interfacial layer is deposited, for example a selected polymer layer 102 may degrade at certain deposition temperatures which should not be exceeded. The deposition temperature may also be selected to achieve specific desired ALD interfacial layer characteristics as described in detail below.

ALD may be used to deposit a layer having any reasonable selected thickness. Homogenous ALD films may be formed having a thickness of 2 nm or less. ALD interfacial layers having a thickness of between 5 and 200 nm have been found to be well suited for use as interfacial layers as described below.

A moisture barrier 100 consistent with the embodiments described herein may also include a barrier layer 106 deposited on the ALD interfacial layer 104. Any suitable method may be used to deposit the barrier layer 106. For example, plasma enhanced chemical vapor deposition (PECVD) has been shown to be well suited for depositing an effective barrier layer 106. The barrier layer may be fabricated from any suitable material. Embodiments of a moisture barrier 100 may include, but are not limited to, implementation with a barrier layer fabricated from a silicon dioxide, silicon oxynitride or silicon nitride compound, which compounds may be generally characterized by the formula $SiO_xN_y$.

Alternative embodiments disclosed herein include devices, products or substrates packaged in a moisture barrier 100 as described herein. The device may be any type of device, product, substrate, or apparatus which in use will be exposed to moisture, water vapor, freeze thaw cycles or other environmental elements which could compromise the longevity or integrity of the device or product. For example, a photovoltaic cell must by its nature be used outside and subjected to rain, snow, fog, dew, environmental contaminants or other substances. The devices which may be packaged or protected by the disclosed moisture barriers include, but not limited, to photovoltaic cells, integrated circuit devices, photonic devices, piezoelectric devices, micro-electromechanical systems, batteries, sensors, actuators, flat panel displays, food, pharmaceuticals, consumer goods, cosmetics and similar devices, products and apparatus. Similarly, the disclosed embodiments include substrates which are encapsulated with the disclosed moisture barriers including, but not limited to, silicon, other semiconductor substrates, mirrored surfaces, plastics, polymers, thin semiconductor films, organic films, inorganic films or metals.

Figure 2A:
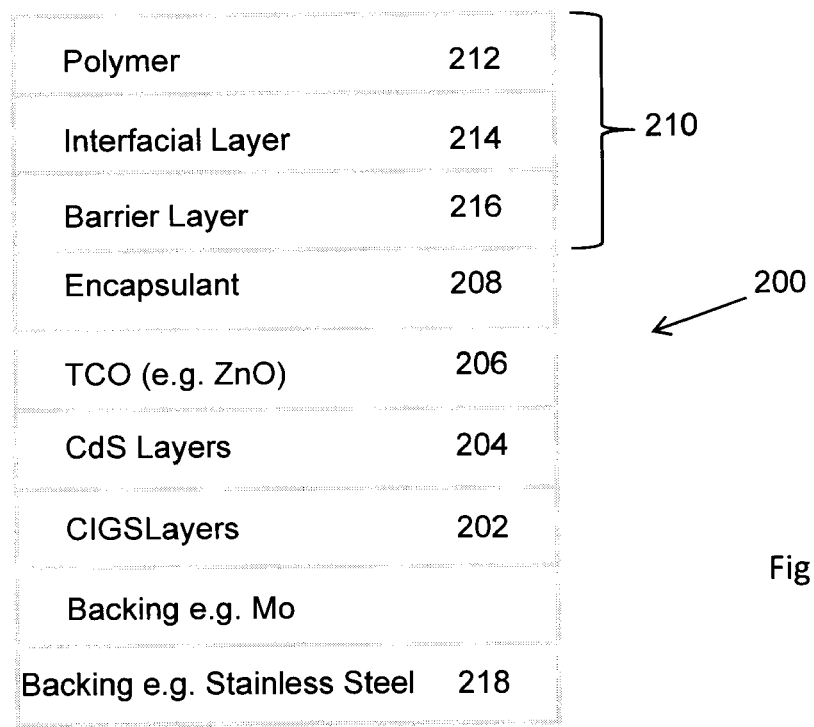
FIGS. 2a-2c are diagrammatic representations of representative devices associated with a moisture barrier.

One non-limiting example of a device featuring a moisture barrier is shown in FIG. 2(a). The FIG. 2(a) embodiment of moisture barrier may be used as a front surface protective package on a semiconductor device such as a thin film copper indium gallium selenide (CIGS) photovoltaic device 200. CIGS-based devices are known to be particularly sensitive to degradation caused by moisture ingress and are thus particularly well-suited to protection by the barriers and methods disclosed herein. As shown in FIG. 2(a), the CIGS active layer 202 and associated CdS active layer 204 may be overlaid by one or more window or transparent superstrate layers for example the zinc oxide or other transparent conducting oxide (TCO) layer 206 and an encapsulant layer for example, EVA layer 208. The superstrate layers typically do not provide a sufficient moisture barrier by themselves. Accordingly, the active semiconductor layers 202, 204 may be protected by the addition of a moisture barrier 210 which may include a polymer layer 212 interfacial layer 214 and barrier layer 216 as described. Alternatively, an interfacial layer, barrier layer, or both may also be inserted in the stack construction between the encapsulant and window layers 206 and or 204 to protect such window layer against possible harmful encapsulant degradation products or adverse effects related to window layer exposure to moisture or other substances potentially present in the installation environment alone or together with a tandem overlying moisture barrier 210.

Figure 2B:
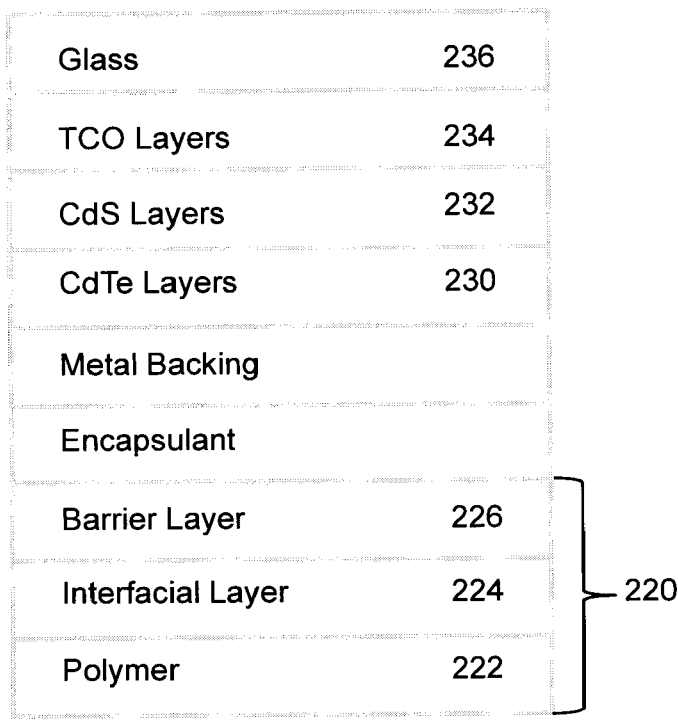

The embodiment shown in FIG. 2(a) features a moisture barrier 210 on the front surface of a thin film solar cell. This particular embodiment features a stainless steel back sheet 218. The embodiments disclosed herein are not limited to this configuration. For example, as shown in FIG. 2b a moisture barrier 220 which includes a polymer layer 222 an interfacial layer 224 and barrier layer 226 may be used to fabricate a moisture resistant back sheet. The representative device shown in FIG. 2b) is a cadmium telluride (CdTe) thin film photovoltaic device 228 featuring CdTe 230 and CdS 232 active layers with a transparent conducting oxide window layer 234 and glass superstrate 236. In an alternative configuration, an interfacial layer, barrier layer, or both may also be inserted in the stack construction between the encapsulant and metal layer to protect the metal layer against possible harmful encapsulant degradation products.

Figure 2C:
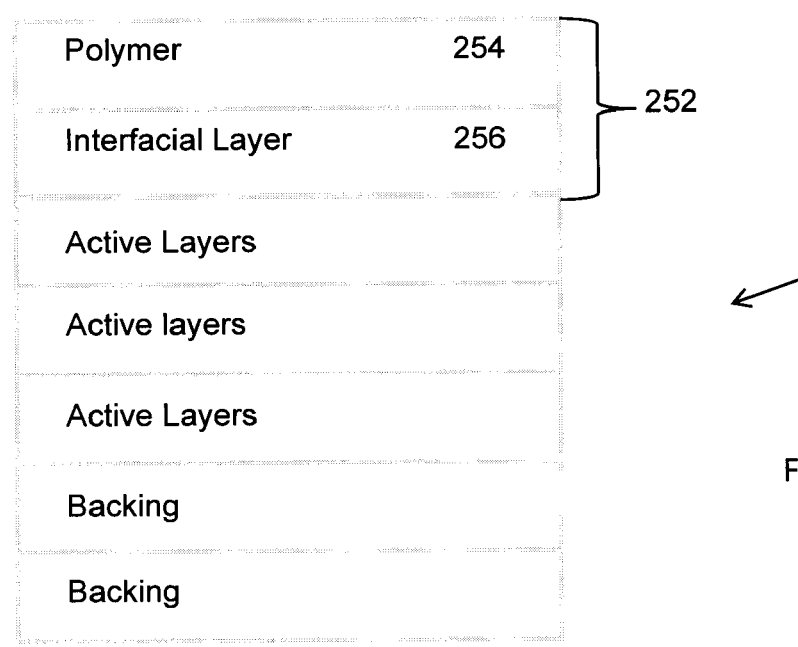

Although the embodiments of FIGS. 2a and 2b feature moisture barriers which include separate polymer, interfacial and barrier layers, the inclusion of each of these types of layer may not be necessary in all implementations. For example, as shown in FIG. 2(c), a CIGS photovoltaic device 250 may be protected by a moisture barrier 252 including only a polymer layer 254 and interfacial layer 256. Other configurations of devices, products or substrates having a front, back or any other surface protected by a moisture barrier as described herein are within the scope of this disclosure. Similarly, the barriers described herein may be used to enhance packaging outside of the field of electronics. For example, the moisture barriers described herein may be used to enhance pharmaceutical blister packs, food packaging and similar materials.

Figure 3:
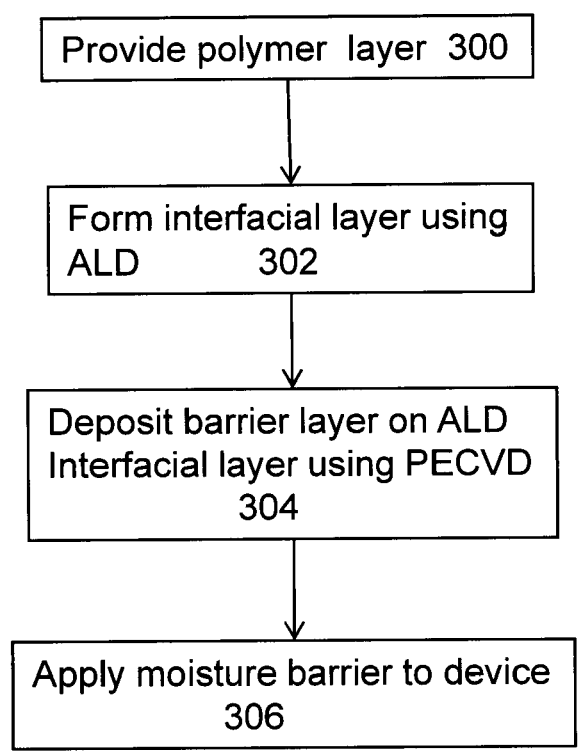
FIG. 3 is a flowchart illustrating a method of preparing a moisture barrier.

Another embodiment disclosed herein is a method for forming a moisture barrier as illustrated in FIG. 3. The method includes providing a polymer layer (step 300). The polymer layer may be fabricated from PET or PEN or any suitable polymer film. The method further includes depositing an interfacial layer on the polymer layer (step 302). The interfacial layer may be applied with atomic layer deposition (ALD). The ALD interfacial layer may be deposited at a selected temperature which is compatible with the selected polymer layer or to achieve specific interfacial layer characteristics. The method also includes depositing a barrier layer on the interfacial layer (step 304). The barrier layer may be deposited by PECVD or another suitable means.

The disclosed methods may optionally include applying a moisture barrier made as described above to a device, product or substrate. Thus, the moisture barrier may be applied to or formed into a package to protect a device such as a photovoltaic cell or product such as a pharmaceutical, food, or other items benefiting from protection.

A suitable moisture barrier for packaging a sensitive device must generally be resistant to the ingress of water or water vapor and sufficiently durable. In particular, the various layers of a multiple layer moisture barrier must resist delamination or separation both initially, and after exposure to moisture and elevated temperatures over a period of time. In addition the entire barrier structure must resist delamination or attachment failure from the device. It is quite common for known prior barriers to perform well initially and yet fail after a period of time exposed to moisture and elevated temperatures.

The moisture-transport properties of candidate moisture barriers may be measured according to ASTM F1249 using a suitable instrument. The desired measurement is water vapor transmittance rate (WVTR) as a function of time. WVTR is defined as the steady state rate at which water vapor permeates through a film at specified conditions of temperature and relative humidity. WVTR is expressed in grams per square meter per day (g/m2/day). The WVTR may be determined over a range of temperatures and relative humidities to simulate field conditions.

Accordingly, the WVTR of specific moisture barriers disclosed herein have typically been measured at three temperatures (40° C./60° C. /85° C.) and at 100% relative humidity. Similarly effective measurements could be made at other temperatures or temperature ranges and over other humidity ranges. Measurement over a temperature range allows the data to be analyzed to obtain activation energies. Moisture barriers as disclosed herein may be categorized as generally belonging to one of the following moisture barrier classes:

I) Effective barriers having a BIF of greater than 5 with Fickian diffusion properties throughout the test. BIF is the "Barrier Improvement Factor." BIF is defined as the ratio of the WVTR of coated film or substrate stack to the WVTR of an uncoated sample of the same film or substrate stack.

II) Initially an effective barrier which gives the appearance of stabilizing at a low WVTR and high BIF but then displays gradual or dramatic loss of moisture barrier properties over time, as observed at a single test temperature.

III) Initially an effective barrier when tested at one temperature, but performs as an ineffective barrier at an alternative temperature.

IV) An ineffective barrier with Fickian diffusion properties throughout the test at all test temperatures.

Figure 4:
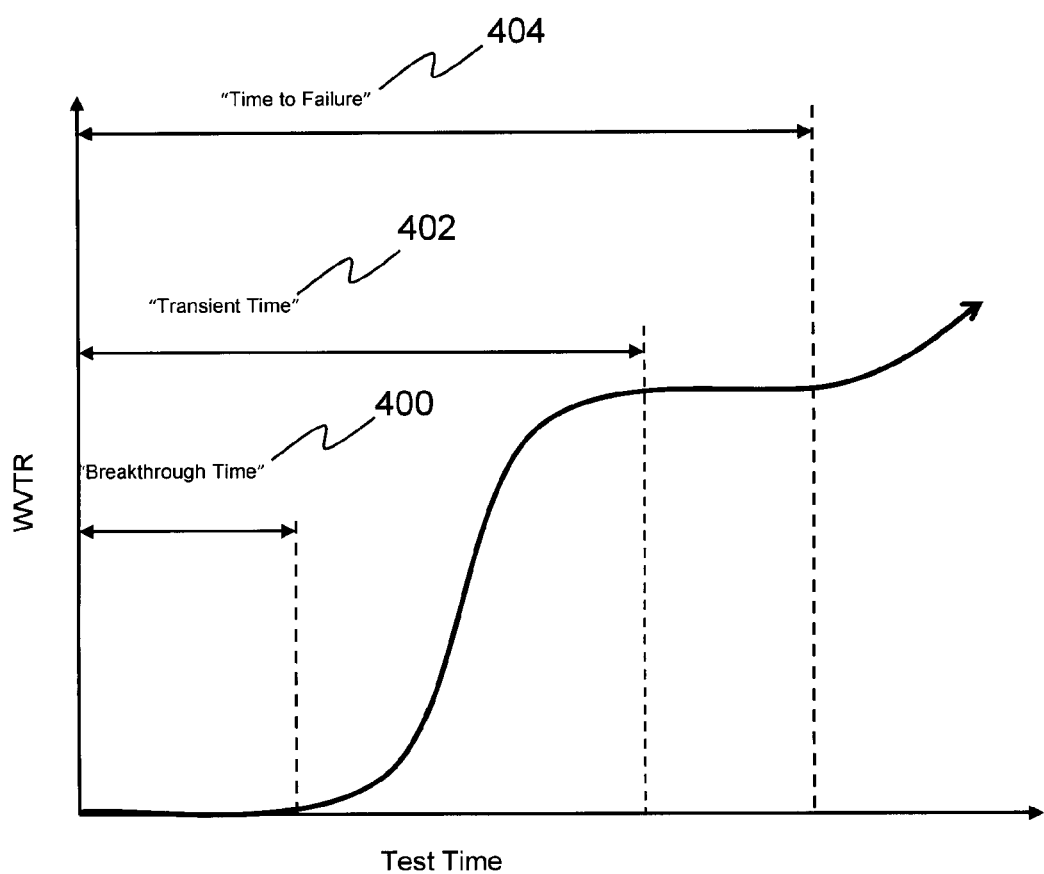
FIG. 4 is a graphic representation of the concepts and nomenclature used to describe selected water vapor transmittance rate (WVTR) characteristics.

In addition to the above categories, new terminology has been utilized herein as displayed in FIG. 4 to further characterize barrier performance during testing. Breakthrough Time 400 is the time between the introduction of water and detection of a non-zero WVTR. Transient Time 402 is the time measured between introduction of water in a remote cell reservoir and the onset of a WVTR plateau. Time to Failure 404 is the time between the introduction of water and the gradual or dramatic increase of WVTR following an initial WVTR plateau. It is important to note that not all barriers necessarily proceed to breakdown and failure.

Successful moisture barriers having more than one layer must retain an adequate bond between the respective layers and with the device to which the barrier is applied. Peel-strength measurements may be made to allow screening of candidate moisture barriers and to test the durability of interfacial adhesion. To measure the adhesion of flexible barrier materials, two layers are bonded together and a 180° T-peel configuration is used. Samples described in detail below were prepared using an Astropower, Inc., model LM-404 solar module vacuum laminator, which replicates the encapsulation procedures used by industry to manufacture encapsulated devices or modules. An Instron 5500R mechanical testing instrument or similar device may be used to make measurements as per ASTM D1876-01. Ideally, peel strength is measured initially (before weathering) and then periodically as a function of damp heat exposure (for example after an extended period of time at 85° C. and 85% relative humidity). Initial peel strength values of ≥4-5 N/mm are desirable, but a challenge of moisture barrier fabrication is the retention of this initial value after an extended period of time, for example after 500 or more hours of damp heat exposure.

EXAMPLES

The following examples are provided for illustrative purposes only and are not intended to limit the scope of the invention.

Example 1

Moisture Barriers Formed by PECVD on Polymer

Amorphous $SiO_xN_y$ films from the array of silicon dioxide, silicon oxynitride, or silicon nitride stoichiometric or non-stoichiometric family of compounds, which may or may not include detectable hydrogen, were selected as candidate barrier layers. These candidate barrier layers feature relatively easy preparation and have good adhesion, transparency and are otherwise compatible with photovoltaic cells.

Synthesis of the various film layers for the examples herein may be accomplished by employing a plasma-enhanced chemical vapor deposition (PECVD) process. Plasmas may be generated using a 600 W Advanced Energy generator and matching network or similar device. With the former, a parallel-plate diode arrangement is used for plasma processing within the process reactor. Between the RF electrode plates, reactant gas species are ionized and excited with 13.56 MHz RF power. Deposition processes for the examples described in detail herein were performed at relatively low power for example near RF power outputs of 12 milliwatts (mW).

Diluted process gases of either silane, $SiH_4$, (3% in molecular nitrogen), and oxygen, $O_2$, (11.45% in He) were used to deposit $SiO_xN_y$ alloy coatings onto the polymer film but other reactant species may otherwise be employed as deemed appropriate for given applications. The process reactor (U-system) includes a load lock (for substrate introduction), a deposition chamber (for application of thin film coatings on substrates), and a backup chamber (for potential emergency pumping redundancy). These chambers are interconnected and isolated from each other via pneumatic slit valves, allowing substrate transfers between chambers. All chambers are individually pumped by means of separate dedicated turbo-molecular pumps and associated backing pumps. Process cycles were usually preceded by pre-equilibration intervals where the relatively inert $N_2$ and He gas flows (without plasma ignition) allowed improved heat transfer between the resistive heater elements and substrates prior to start of vacuum deposition process cycles. Substrate temperatures were maintained with a resistive heater element and controller typically set to provide substrate temperatures near 95° C. Actual substrate temperatures are likely to vary somewhat from run to run, depending in part on the RF power, equilibration time, gas flows, turbo speeds, and thermal mass of the incorporated substrate components being coated.

Deposition variables such as reactant types, concentration inputs, gas flow rates, temperatures, reaction kinetics, pressures, reactor geometry, and substrate properties (material chemistry, morphology, orientation, etc.) all determine properties of resultant films and realized deposition or thru-put rates.

A series of PECVD barrier depositions on PET and PEN were conducted with the intent of establishing correlations between the deposition chemical composition and thickness and the measured barrier efficacy. Deposition compositions included varieties of the following deposition compounds; $SiO_x$, $SiO_xN_y$, and $Si_xN_y$ but not necessarily limited to these reactant species alone. The PECVD on PET barriers were determined to be moderately effective in performance with BIF values ranging from 1.1-1.4 for $Si_xN_y$ films to 2.1 to 5.8 for $SiO_xN_y$ films. For the $SiO_xN_y$/PET barrier film, it appears there might be a direct correlation between barrier efficacy and nitrogen content. Barriers with a composition of nearly $Si_3N_4$ exhibited the poorest performance with very low BIF values of 1.04-1.2. All of the barriers produced using PECVD on PET were classified either in performance category IV or category III based on measured WVTR performance. Initial (t=0) adhesion values of the PECVD coated PET samples as measured by T-peel tests was excellent; however, after damp heat exposure at 85° C. and 85% relative humidity little to no adhesion remained. This has been a common observation with PECVD barrier coated polymer films. Initial adhesion is high, so high in fact that sometimes that the peel tabs tear before a peel can be initiated. However, observations suggest there is little or no measured retention of the intra-layer adhesion after damp heat exposure.

Example 2

ALD Coated PET Without Subsequent Barrier Layer

The moisture barrier described in Example 1 includes a polymer substrate such as PET onto which dense inorganic coatings have been deposited by PECVD. A problem with this construction is the delamination of the coating from the PET film after fairly short (25-100 hour) exposure to damp heat. One of many alternative methods of depositing an inorganic compound on a polymer is ALD. ALD utilizes sequential precursor gas pulses to deposit a film one layer at a time. Such multi-monolayer coatings are highly conformal, dense, and substantially pinhole free. 100 to 1 aspect ratios can be achieved, allowing nearly 100% step coverage of very deep vias.

Figure 5:
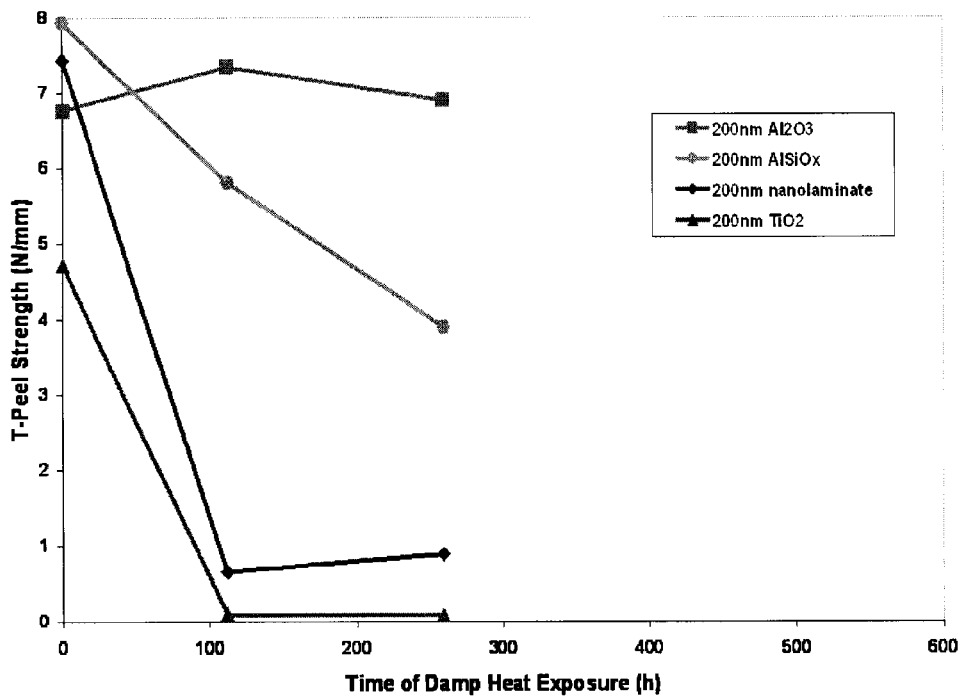
FIG. 5 is a graphic representation of T-peel strength as a function of the length of damp heat exposure for samples prepared by ALD deposition on PET.

An initial set of samples was prepared by the ALD deposition of four types of ALD coatings onto PET film substrates. The ALD coatings selected included $Al_2O_3$, $AlSiO_x$, $Al_2O_3MO_2$ nanolaminate and $TiO_2$. Each of the four films was applied to achieve a final approximate layer depth of 200 nm. The PET used was 7 mil Melinex® ST-504 from DuPont®. Typically the PET films are approximately 200 mm×290 mm in size and 0.18 mm thick. The ALD process coats both sides of the PET substrate. Since ST504 PET has a pure PET side and a treated side, only the ALD/pure PET side was laminated to a substrate. In the case of these samples the selected substrate was ethylene vinyl acetate (EVA); although any other suitable substrate could be used for the described tests. After lamination to the EVA, T-peel tests were performed on the following construction: ALD-coated PET/EVA/ALD-coated PET. The peel strength of these samples was measured as a function of time of damp heat exposure and the results of this test are shown in FIG. 5. The 200 nm nanolaminate and 200 nm $TiO_2$ samples failed after 100 hours exposure. The 200 nm $AlSiO_x$ sample degraded but did not fail completely. The 200 nm $Al_2O_3$ coated sample retained its adhesion strength after 259 hours of damp heat exposure.

Figure 6:
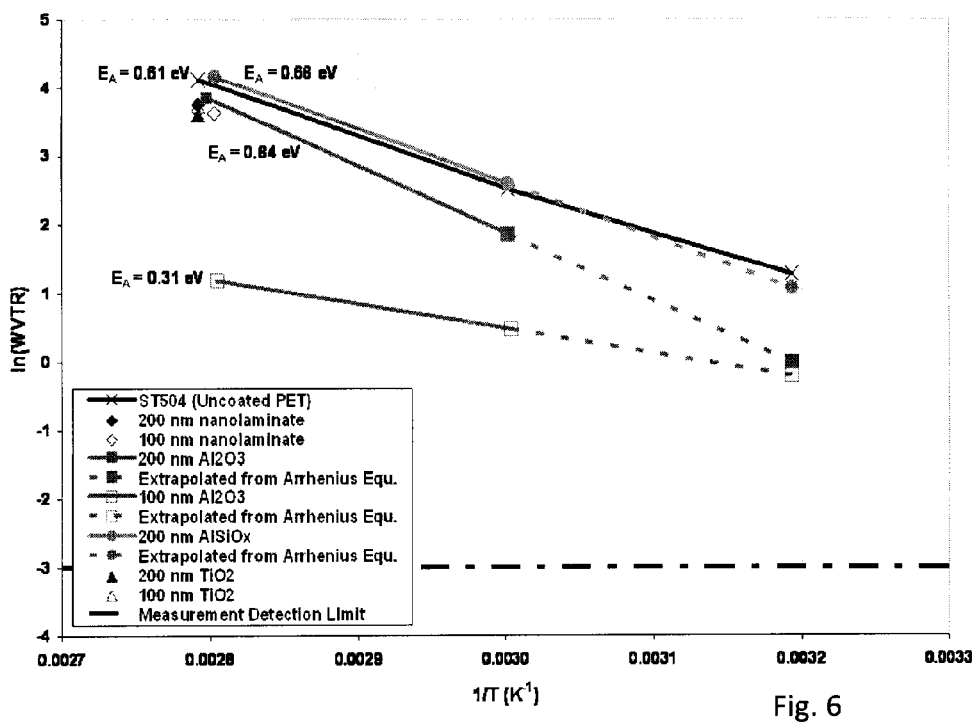
FIG. 6 is a graphic representation of the WVTR characteristics of the samples of FIG. 5.

Water vapor transmittance rate (WVTR) measurements were also made for several of these samples. FIG. 6 presents an Arrhenius plot of WVTR vs. inverse test temperature. Uncoated PET is shown for comparison. The associated activation energies ($E_A$) are also given. A sample having a thinner coating of $Al_2O_3$ (100 nm) demonstrated very low WVTR values at elevated test temperatures (~3.3 $g/m^2/d$ at 85° C. and ~1.6 $g/m^2/d$ at 60° C.). These results are roughly a factor of four better than known commercial moisture barriers.

Thinner ALD coatings may provide improved WVTR properties, presumably because in this specific application the barrier layer is less susceptible to cracking. A second set of samples using the same deposition compounds but having thinner ALD coatings was prepared for evaluation. Coating thicknesses ranging from 5 nm to 25 nm were tested. FIG. 7 presents T-peel results for selected samples of thinner ALD-coated PET. As with the first set of samples, the $AlSiO_x$ and some of the $Al_2O_3$ ALD coatings exhibited good adhesion for damp heat exposure times greater than 500 hours. The $TiO_2$ ALD coatings exhibited poor adhesion after only 100 hours exposure. WVTR results for the $Al_2O_3$ ALD coated PET samples are shown in FIG. 8(a). The 5 nm thick coating was too thin, showing little improvement over uncoated PET. The 10 nm thick coating demonstrated an intermediate improvement, having roughly the same activation energy as uncoated PET but a BIF of roughly 4.5. One of the 25 nm thick $Al_2O_3$ coated samples (replicate 3 of precursor 2) performed similar to the 10 nm coated PET. Three other samples coated with 25 nm of $Al_2O_3$ exhibited even greater improvement, including having activation energies in the range 0.91-1.24 eV. It should be noted that a high activation energy value for a barrier or barrier package is a very desirable characteristic and one that is not often seen in known moisture barriers. A high activation energy indicates that in addition to a physical barrier, there is a chemical interaction between the water and the barrier film which additionally hinders moisture transport through the film. Thus, a moisture barrier which features a high activation energy exhibits a synergistic physical and chemical resistance to water transport which is extremely beneficial to the proper functioning of a moisture barrier. WVTR data for 5 and 25 nm thick ALD coatings of $AlSiO_x$ and $TiO_2$ on PET are included in FIG. 8(b). The $AlSiO_x$ coatings provided very little improvement over uncoated PET, and the $TiO_2$ coated samples were only marginally better, with a BIF of ~2.5.

Example 3

PECVD Overcoated ALD-PET

In parallel with evaluation of the ALD coated PET described in Example 2, a variety of PECVD-coated PET materials were prepared and made into T-peel samples having the following construction: PECVD-coated PET/EVA/PECVD-coated PET. As shown in FIG. 9, representative samples typically have good initial adhesion but the coating delaminates from the PET film after 100-250 h exposure to 85° C. and 85% relative humidity. Samples were then prepared by overcoating the ALD/PET barriers of Example 2 with one or more PECVD applied barrier layers. T-peel samples were prepared and tested; the results for T-peel values vs. damp heat exposure time for representative samples is shown in FIG. 10. The samples measured for FIG. 10 included a PECVD coating formulation deposited over ALD deposited $AlSiO_x$ on PET. The initial adhesion properties of these samples were retained for over 250 hours of damp heat exposure and when a T-peel measurement was attempted after 500 hours of damp heat exposure, it was the PET which actually tore before layer delamination was initiated. Previous analysis of films created using the selected PECVD gas recipe has determined that the composition of the barrier film of this example is between $SiO_{1.6}N_{0.3}$ and $SiO_{1.9}N_{0.1}$ depending on exactly where the sample is harvested from the sample sheet. WVTR measurements of the PECVD overcoated $AlSiO_x$ ALD coated PET are presented in FIG. 11 and Table 1. Two initial points are noteworthy: 1) The WVTR values for 25 nm $AlSiO_x$ deposited by ALD on ST504 PET (with no over coating) are only slightly lower than those for uncoated ST504 PET; and 2) The activation energy for 25 nm $AlSiO_x$ deposited by ALD on PET, again with no over coating is nearly the same as that of uncoated ST504 PET. WVTR improves substantially, however, upon the application of a $SiO_xN_y$ PECVD barrier film over the $AlSiO_x$ ALD-coated PET. In fact, WVTR values at 40° C. were below the instrument's detection limit (about 0.05 g/m²/day). The measured WVTR values are much higher than either uncoated PET or $AlSiO_x$ ALD coated PET without an over coat. Extrapolation of the Arrhenius activation energy plots yields 25° C. WVTR values of 0.038 g/m²/day and 0.0042 g/m²/day for the samples with activation energy values of 0.84 eV and 1.14 eV respectively.

TABLE 1

Performance values for PET polymer, ALD-PET, and PECVD overcoated ALD-PET

| Description | Temperature (° C.) | WVTR (g/m²/d) | BIF | $E_a$ (eV) |
|---|---|---|---|---|
| ST504 PET | 25 | 1.08* | | 0.61 |
| | 40 | 3.655 | | |
| | 60 | 12.455 | | |
| | 85 | 61.405 | | |
| 25 nm ALD applied $AlSiO_x$/PET | 25 | 1.04* | 1.04 | 0.58 |
| | 40 | 3.22 | 1.14 | |
| | 60 | 10.65 | 1.17 | |
| | 85 | 48.19 | 1.27 | |
| PECVD overcoat sample 1 | 25 | 0.00416* | 260 | 1.14 |
| | 40 | 0.0376* | 97 | |
| | 60 | 0.53 | 23.5 | |
| | 85 | 9.32 | 6.6 | |
| PECVD overcoat sample 2 | 25 | 0.0377* | 28.6 | 0.84 |
| | 40 | <0.05 | | |
| | 60 | 1.18 | 10.6 | |
| | 85 | 9.01 | 6.8 | |

*Determined by extrapolation from Arrhenius plot

The addition of an interfacial layer, in particular an ALD applied interfacial layer, between the PET and the PECVD barrier layer has enabled retention of intra-layer adhesion properties that have not been previously possible with PECVD barrier layer over polymer films alone. It has been shown that the plasma exposure of PET without an interfacial layer causes chain scissioning of the PET structure resulting in water soluble, low molecular weight fragments that are subsequently responsible for damp heat induced interfacial adhesion loss. Results suggest an interfacial ALD layer provides a protective surface layer over the PET such that during the subsequent PECVD barrier deposition process, chain scissioning of the PET substrate can not occur. Although the ALD applied $AlSiO_x$ layer by itself is a poor barrier with BIF values barely above 1.0, this layer plays the important role of an interfacial adhesion layer between the PET and the PECVD barrier film. Once the PECVD barrier layer is applied to the PET/$AlSiO_x$ structure, not only do the WVTR values drop but the Arrhenius activation energy for the completed structure (PET/$AlSiO_x$/$SiO_xN_y$) has a higher activation energy than for PET alone or PET with ALD applied $AlSiO_x$. Lowered WVTR values for the completed structure indicate the $SiO_xN_y$ layer is acting as a good physical barrier to moisture, but in addition, it is providing a strong chemical interaction with water by virtue of the high Arrhenius activation energy observed. Water molecules must continually overcome this high activation energy as they diffuse through the barrier layer. A high Arrhenius activation energy for a barrier (relative to the substrate) is not routinely observed for barriers reported in the literature. Thus, the combination of an ALD applied interfacial layer with a PECVD barrier layer on a polymer substrate results in performance characteristics which vastly exceed the results predictable by evaluation of the possible subcombinations of these materials. In summary, the ALD layer acts as protective interfacial adhesion layer for damp heat adhesion retention, and the $SiO_xN_y$ layer acts as both a physical and chemical barrier to moisture transport. BIF values for the overcoated structures of this example are as high as 260 at room temperature and almost 100 at 40° C. A typical room temperature BIF value for food and pharmaceutical moisture barrier packaging is around 100.

Example 4

ALD on PET at Selected Temperatures

A third set of ALD-coated PET samples was prepared. These samples were used to explore the effect of deposition temperature on adhesion and moisture barrier properties. In examples 2 and 3, ALD deposition temperatures of less than 100° C. were used, limited by the thermal properties of the PET substrate. Peel strength was measured for these samples and compared with the peel strength of samples ALD-coated PET substrates prepared at other selected temperatures, for example 75° C., 115° C. and 150° C. As seen in FIG. 12, the higher temperature ALD formulations failed after 250 hours of damp heat exposure. The 25 nm $AlSiO_x$/PET sample prepared at 100° C. experienced some loss in adhesion but did not fail. The adhesion of the 30 nm $Al_2O_3$/$TiO_2$ nanolayer coating prepared at 100° C. performed extremely poorly, failing even before exposure to damp heat (t=0). The effect of deposition temperature of the ALD coatings on WVTR measurements is clearly evident in FIG. 13. Coatings deposited at 100° C. show some improvement compared to uncoated PET. However, coatings deposited at 150° C. demonstrate even greater improvement, including increased activation energies. The marginal results for $AlSiO_x$ and $TiO_2$ ALD coated PET (FIG. 14) are nearly identical to those deposited at lower temperatures in ALD sample set #2 (FIG. 8). However, the WVTR measurements for the 30 nm $Al_2O_3$/$TiO_2$ nanolaminate coating were the lowest values observed to date. Thus, it may be concluded that deposition of ALD coatings at higher temperatures greatly improves the WVTR of the ALD/polymer combination but adversely effects adhesion properties. These conclusions are based upon the use of a PET polymer layer. Other suitable polymers may better withstand higher deposition temperatures. For example, the glass transition point ($T_g$) of Teijin Dupont® PEN has been determined to be around 126° C. The $T_g$ of ST504 PET is around 94° C. As such, PEN based barriers may allow higher temperature deposition while overcoming adverse effects to adhesion observed with PET substrates.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method of forming a moisture barrier comprising:
   providing a polymer layer;
   depositing an ALD interfacial layer on the polymer layer; and
   depositing a barrier layer on the ALD interfacial layer;
   wherein the interfacial layer is disposed directly between the polymer layer and the barrier layer, and
   the barrier layer comprises a $SiO_xN_y$ film.

2. The method of forming a moisture barrier of claim 1 further comprising:
   providing a device substrate; and
   associating the barrier layer with the device substrate.

3. The method of forming a moisture barrier of claim 1 wherein the polymer layer comprises at least one of polyethylene terephthalate, polyethylene naphthalate and ethylene-tetrafluoroethylene.

4. The method of forming a moisture barrier of claim 1 further comprising depositing the ALD interfacial layer at a temperature of less than 100° C.

5. The method of forming a moisture barrier of claim 1 further comprising depositing the ALD interfacial layer at a temperature of between 100° C. and 150° C.

6. The method of forming a moisture barrier of claim 1 further comprising depositing the ALD interfacial layer at a temperature of greater than 150° C.

\* \* \* \* \*